United States Patent
Gates et al.

(10) Patent No.: US 8,268,411 B2
(45) Date of Patent: Sep. 18, 2012

(54) MATERIALS CONTAINING VOIDS WITH VOID SIZE CONTROLLED ON THE NANOMETER SCALE

(75) Inventors: Stephen M. Gates, Ossining, NY (US); Alfred Grill, White Plains, NY (US); Deborah A. Neumayer, Danbury, CT (US); Son Nguyen, Yorktown Heights, NY (US); Vishnubhai V. Patel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 12/538,117

(22) Filed: Aug. 8, 2009

(65) Prior Publication Data

US 2009/0297729 A1    Dec. 3, 2009

Related U.S. Application Data

(62) Division of application No. 11/190,360, filed on Jul. 27, 2005, now Pat. No. 7,674,521.

(51) Int. Cl.
*B05D 3/06* (2006.01)
(52) U.S. Cl. ........ 427/577; 427/579; 438/780; 438/787; 438/788; 438/790; 521/61; 521/63; 521/131; 521/133; 521/154
(58) Field of Classification Search .......... 427/577, 427/579; 438/780, 787, 788, 790; 521/61, 521/63, 131, 133, 154
See application file for complete search history.

(56) References Cited

U.S. PATENT DOCUMENTS

| 5,645,891 | A | 7/1997 | Liu et al. |
|---|---|---|---|
| 5,963,417 | A | 10/1999 | Anderson et al. |
| 6,147,009 | A | 11/2000 | Grill et al. |
| 6,312,793 | B1 | 11/2001 | Grill et al. |
| 6,380,550 | B1 | 4/2002 | Canham et al. |
| 6,410,480 | B1 | 6/2002 | Muehlebach et al. |
| 6,437,443 | B1 | 8/2002 | Grill et al. |
| 6,441,491 | B1 | 8/2002 | Grill et al. |
| 6,479,110 | B2 | 11/2002 | Grill et al. |
| 6,497,963 | B1 | 12/2002 | Grill et al. |
| 6,541,398 | B2 | 4/2003 | Grill et al. |
| 6,723,388 | B2 | 4/2004 | Svendsen et al. |
| 6,737,118 | B2 | 5/2004 | Yamada et al. |
| 6,780,499 | B2 | 8/2004 | Gates et al. |
| 2002/0096688 | A1 | 7/2002 | Canham et al. |
| 2003/0005772 | A1 | 1/2003 | Hegner et al. |
| 2003/0194880 | A1 * | 10/2003 | Singh et al. .......... 438/778 |
| 2003/0232495 | A1 * | 12/2003 | Moghadam et al. ......... 438/623 |
| 2005/0087760 | A1 | 4/2005 | Canham et al. |
| 2005/0181930 | A1 | 8/2005 | Roziere et al. |
| 2006/0079099 | A1 | 4/2006 | Nguyen et al. |
| 2007/0004064 | A1 | 1/2007 | Canham et al. |

FOREIGN PATENT DOCUMENTS

| CN | 1185234 A | 6/1998 |
|---|---|---|
| EP | 1332795 | 8/2003 |

OTHER PUBLICATIONS

Definition of Full Width at Half Maximum from Wikipedia, Aug. 7, 2009.
Translation of JP 10-218690, Seki et al., Production of Silicious Porous Film, Aug. 18, 1998.

\* cited by examiner

*Primary Examiner* — Irina S Zemel
(74) *Attorney, Agent, or Firm* — Scully, Scott, Murphy & Presser, P.C.; Louis J. Percello, Esq.

(57) ABSTRACT

A method of forming a porous composite material in which substantially all of the pores within the composite material are small having a diameter of about 5 nm or less and with a narrow PSD is provided. The porous composite material includes a first solid phase having a first characteristic dimension and a second phase comprised of pores having a second characteristic dimension, wherein the characteristic dimensions of at least one of said phases is controlled to a value of about 5 nm or less.

13 Claims, 3 Drawing Sheets

MATERIALS CONTAINING VOIDS WITH VOID SIZE CONTROLLED ON THE NANOMETER SCALE

CROSS-REFERENCE TO RELATED APPLICATIONS

This application is a divisional of U.S. Ser. No. 11/190,360, filed Jul 27, 2005, now U.S. Pat. No. 7,674,521, the entire contents of which are incorporated herein by reference.

BACKGROUND

The present invention relates to a composite material useful in semiconductor device manufacturing, and more particular to a set of porous composite materials in which the diameter (or characteristic dimension) of the pores and the pore size distribution (PSD) is controlled in a nanoscale manner. The term "nanoscale" is used herein to denote pores that are less than about 5 nm in diameter. The present invention also provides a method of fabricating the porous composite materials of the present application.

Generally, the speed of an integrated microprocessor circuit can be limited by the speed of electrical signal propagation through the BEOL (back-end-of-the-line) interconnects. Ultralow k (ULK) dielectric materials having a dielectric constant of about 3.2 or less permit a BEOL interconnect structure to transmit electrical signals faster, with lower power loss, and with less cross-talk between metal conductors such as, for example, Cu. Porous materials typically have a dielectric constant that is less than the non-porous version of the same material. Typically, porous materials are useful for a range of applications including, for example, as an interlevel or intralevel dielectric of an interconnect structure.

A typical porous dielectric material is comprised of a first solid phase and a second phase comprising voids or pores. The terms "voids" and "pores" are used interchangeably in the present application. A common aspect of porous materials is the problem of controlling the characteristic dimensions of the pores and the pore size distribution (PSD). The size and PSD have strong effects on the properties of the material. Specific properties that may be affected by the pores size or the PSD of a dielectric material include, for example, electrical, chemical, structural and optical. Also, the processing steps used in fabricating the BEOL interconnect structure can degrade the properties of an ULK dielectric, and the amount of degradation is dependant on the size of the pores in the ULK dielectric. The foregoing may be referred to as "processing damage". The presence of large pores (larger than the maximum in the pore size distribution) leads to excessive processing damage because plasma species, water, and processing chemicals can move easily through large pores and can become trapped in the pores.

Typically, the pores in an ULK dielectric have an average size (i.e., majority of the pores) and also have a component of the PSD that is comprised of larger pores (on the order of a few nm) with a broad distribution of larger sizes due to pore connection as the pore density increases (i.e., minority population of larger pores).

The minority population of larger pores allows both liquid and gas phase chemicals to penetrate into the ULK film more rapidly. These chemicals are found in both wet and plasma treatments that are routinely used during integration of the ULK dielectric material to build an interconnect structure.

The above-mentioned problems are not specific to porous dielectric materials. Instead, they are generally present in non-dielectric materials including, for example, semiconducting, ceramic and metal.

In view of the above, there is a need for providing composite materials in which all the pores within the composite material are small having a diameter of about 5 nm or less and with a narrow PSD. There is also need for providing a method of fabricating composite materials in which the broad distribution of larger sized pores is substantially eliminated from the material.

BRIEF SUMMARY

The present invention provides a porous composite material in which substantially all of the pores within the composite material are small having a diameter of about 5 nm or less, preferably about 3 nm or less, and even more preferably about 1 nm or less, and with a narrow PSD. The term "narrow PSD" is used throughout the instant application to denote a measured pore size distribution with a full width at half maximum (FWHM) of about 1 to about 3 nm. PSD is measured using a common technique known in the art including, but not limited to: ellipsometric porosimetry (EP), positron annihilation spectroscopy (PALS), gas adsorption methods, X-ray scattering or another method.

The inventive composite material is also characterized by the substantial absence of the broad distribution of larger sized pores which is prevalent in prior art porous composite materials. The composite materials of the present invention are an advancement over the prior art, in one aspect, since they do not allow wet chemicals to penetrate beyond the exposed surfaces of the material during a wet chemical cleaning process. Moreover, the composite materials of the present invention are an advancement over the prior art, in a second aspect, since they do not allow plasma treatments based on $O_2$, $H_2$, $NH_3$, $H_2O$, $CO$, $CO_2$, $CH_3OH$, $C_2H_5OH$, noble gases and related mixtures of these gases to penetrate beyond the exposed surfaces of the material during integration thereof.

The term "composite material" includes dielectric materials, semiconducting materials, ceramic materials, or metals.

In broad terms, the inventive porous composite material comprises a first solid phase having a first characteristic dimension and a second solid phase comprised of pores having a second characteristic dimension, wherein the characteristic dimensions of at least one of said phases is controlled to a value of about 5 nm or less.

In a preferred embodiment of the present invention, the porous composite material is a dielectric material having a dielectric constant of about 3.2 or less, preferably about 3.0 or less.

In addition to providing a porous composite material, the present invention also provides a method of fabricating the porous composite material. Specifically, and in broad terms, the method of the present invention comprises providing at least a first precursor and a second precursor into a reactor chamber, wherein at least one of said first or second precursors is a porogen; optionally adding a flow of a gas comprising one of $CO$, $CO_2$, $O_2$, $N_2O$, $N_2$, Ar, He, Ne, Xe or Kr; depositing a film comprising a first phase and a second phase; and removing said porogen from said film to provide a porous composite material comprising a first solid phase having a first characteristic dimension and a second solid phase comprised of pores having at second characteristic dimension, wherein the characteristic dimensions of at least one of said phases is controlled to a value of about 5 nm or less.

In a preferred embodiment of said method, said porogen comprises a compound having one C=C bond.

DETAILED DESCRIPTION

The present invention, which provides porous composite materials containing pores with pore size control on the nanometer scale as well as a method of fabricating the porous material, will now be described in greater detail by referring to the following discussion. In some embodiments of the present invention, drawings are provided to illustrate structures that include the porous composite material of the present invention. In those drawings, the structures are not shown to scale.

The discussion that follows is broken up into different sections that include various embodiments of the present invention. The first section (i.e., Embodiment 1) describes porous dielectric materials of the present invention and a method of fabricating the porous dielectric material. The second section (i.e., Embodiment 2) describes porous semiconducting material and a method of fabricating the same. The third section of the present application (i.e., Embodiment 3) describes porous catalyst materials and a method of forming the same, and the fourth section (i.e., Embodiment 4) describes porous ceramic materials and a method of making the same.

Embodiment 1

In this embodiment, porous dielectric materials having a dielectric constant of about 3.2 or less, preferably about 3.0 or less, and even more preferably about 2.7 or less are provided. The dielectric material of the present invention is comprised of a first solid phase and a second phase that is a collection of pores. The first solid phase of the porous dielectric material of the present invention includes atoms of at least Si, C, O and H. The first solid phase may optionally include other elements such as, for example, N, F, Ge, B, P or any combination thereof.

The second phase of the inventive porous dielectric material is a collection of pores having a pore size distribution (PSD) in which the PSD has a maximum that is less than about 1 nanometer, a full width at half maximum (FWHM) in the PSD of 1-3 nm, and with a fraction less than 0.1 of pores having a pore size of greater than about 1 nanometer. It is noted that the porous dielectric material of the present invention thus has a tight PSD that is controlled within the nanoscale range.

Figure 1:
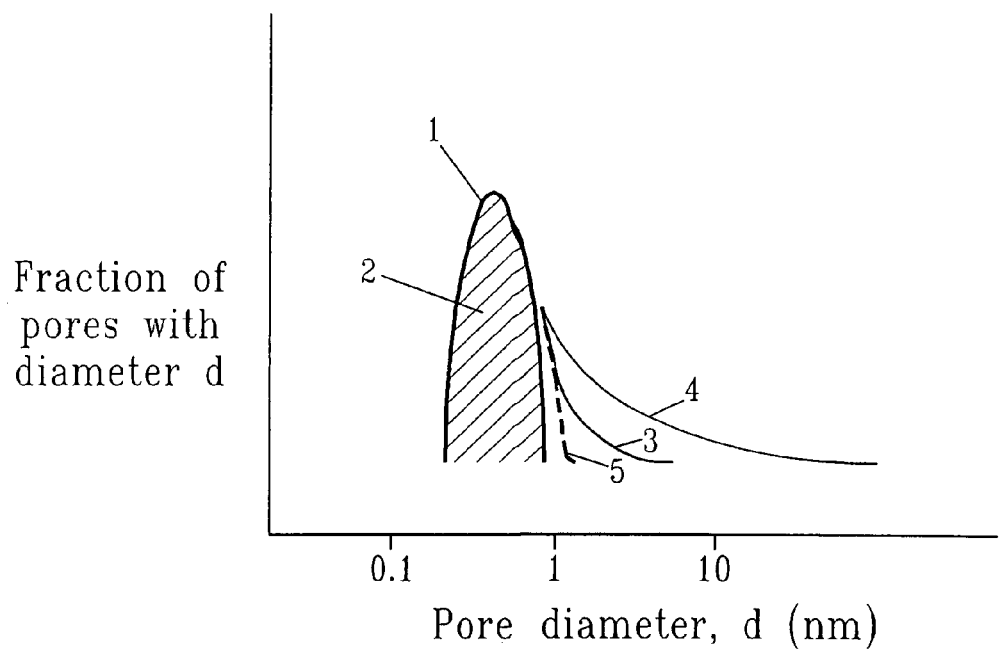
FIG. 1 is a schematic pore size distribution of the material described in the first embodiment of the present application.

In a preferred embodiment, the fraction of pores having a pore size of greater than 1 nanometer is less than 0.05. The pore size distribution of the dielectric material of the first embodiment is schematically shown in FIG. 1. In this drawing, the curve labeled 1 is the PSD of the majority fraction of the pores of the inventive porous dielectric material, and the shaded area under Curve 1 is labeled 2, and is the fraction of the pores having a diameter of less than 1 nm. The component of pores larger than 1 nm is labeled 4 for a typical material of the prior art, and the component of pores larger than 1 nm for the material of the first embodiment is labeled 3. The component of pores larger than 1 nm for the most preferred material of the first embodiment is the dashed line labeled 5.

The porous dielectric material of the first embodiment is made by a first method, which is now discussed in detail. The first method is related to methods described in U.S. Pat. Nos. 6,147,009, 6,312,793, 6,441,491, 6,437,443, 6,541,398, 6,479,110 B2, and 6,497,963, the contents of which are incorporated herein by reference. In the deposition process, the inventive porous dielectric material is formed by providing a mixture of at least two precursors, one of which includes a porogen, into a reactor, preferably the reactor is a PECVD reactor, and then depositing a film derived from the mixture of precursors onto a suitable substrate utilizing conditions that are effective in forming the porous dielectric material of the present invention. Within the present invention, correct choice of a porogen enables the control of the pore size and PSD in the material of the first embodiment. Optionally, a flow of a gas comprising one of CO, $CO_2$, $O_2$, $N_2O$, $N_2$, Ar, He, Ne, Xe or Kr is added to the reactor.

The mixture of at least two precursors contains at least a first alkoxysilane or alkoxycarbosilane precursor (liquid, gas or vapor) comprising atoms of Si, C, O, and H, and an inert carrier such as He, Ar or mixtures thereof, and a porogen precursor. Within the present invention, the first precursor comprises any alkoxysilane molecule, including, for example, diethoxymethylsilane (DEMS), dimethylethoxysilane, dimethyldimethoxysilane, tetramethylcyclotetrasiloxane (TMCTS), or octamethylcyclotetrasiloxane (OMCTS). Other alkoxysilanes are also contemplated in the present invention and, as such, the present invention is not limited to the specific list of alkoxysilanes provided herein.

In addition to the first precursor, a second precursor (gas, liquid or vapor) is used. The second precursor in the first embodiment of the present invention is a porogen such as a hydrocarbon with one double bond (i.e., an alkene molecule). The size of the alkene precursor is adjusted in order to adjust the typical dimension of the pores (the size of the maximum in the PSD). Referring to FIG. 1, curve 3 shows a schematic result obtained using 1-butene as the second precursor.

The second precursor employed in this embodiment of the present invention includes, but is not limited to: ethylene, propylene, butene, pentene, hexene, heptene, octene, and larger alkenes with greater than 8, preferably greater than 10, carbon atoms. The second precursor may also comprise a cyclic alkene containing at least one C=C double bond.

The present invention yet further provides for optionally adding an oxidizing agent such as $O_2$, $N_2O$, $CO_2$ or a combination thereof to the gas mixture, thereby stabilizing the reactants in the reactor and improving the properties and uniformity of the porous dielectric material being deposited. Optionally, a flow of a gas comprising one of CO, $N_2$, Ar, He, Ne, Xe or Kr may be added to improve the film.

The method of the present invention may further comprise the step of providing a parallel plate reactor, which has an area of a substrate chuck from about 85 $cm^2$ to about 750 $cm^2$, and a gap between the substrate and a top electrode from about 1 cm to about 12 cm. A high frequency RF power is applied to one of the electrodes at a frequency from about 0.45 MHz to about 200 MHz. Optionally, an additional RF power of lower frequency than the first RF power can be applied to one of the electrodes.

The conditions used for the deposition step may vary depending on the desired final dielectric constant of the porous dielectric material of the present invention. Broadly, the conditions used for providing a stable porous dielectric material comprising elements of Si, C, O, and H, and having a tensile stress of less than 60 MPa, an elastic modulus from about 2 to about 15 GPa, and a hardness from about 0.2 to about 2 GPa include: setting the substrate temperature within a range from about 100° C. to about 425° C.; setting the high frequency RF power density within a range from about 0.1 W/cm$^2$ to about 2.0 W/cm$^2$; setting the first liquid precursor flow rate within a range from about 10 mg/min to about 5000 mg/min, setting the second liquid precursor flow rate within a range from about 10 mg/min to about 5,000 mg/min; optionally setting the inert carrier gases, such as helium (or/and argon) flow rate within a range from about 10 sccm to about 5000 sccm; setting the reactor pressure within a range from about 1000 mTorr to about 10,000 mTorr; and setting the high frequency RF power within a range from about 50 W to about 1000 W. Optionally, a lower frequency power may be added to the plasma within a range from about 20 W to about 400 W. When the conductive area of the substrate chuck is changed by a factor of X, the RF power applied to the substrate chuck is also changed by a factor of X. When an oxidizing agent is employed in the present invention, it is flowed into the reactor at a flow rate within a range from about 10 sccm to about 1000 sccm.

While liquid precursors are used in the above example, it is known in the art that the organosilicon gas phase precursors (such as trimethylsilane) can also be used for the deposition. Optionally, after the as deposited film is prepared, a cure or treatment step may be applied to the film, according to the details described below.

An example of the first method of the present invention is now described to make the material of the first embodiment.

A 300 mm or 200 mm substrate is placed in a PECVD reactor on a heated wafer chuck at 300°-425° C. and preferably at 350°-400° C. Any PECVD deposition reactor may be used within the present invention. Gas and liquid precursor flows are then stabilized to reach a pressure in the range from 1-10 Torr, and RF radiation is applied to the reactor showerhead for a time from about 5 to about 500 seconds. Optionally, a flow of a gas comprising one of CO, $CO_2$, $O^2$, $N_2O$, $N_2$, Ar, He, Ne, Xe or Kr is added to the reactor.

For the growth of the material of the first embodiment either one or two precursors may be used, as described in U.S. Pat. Nos. 6,147,009, 6,312,793, 6,441,491, 6,437,443, 6,541,398, 6,479,110 B2, and 6,497,963, the contents of which are incorporated herein by reference. The first precursor may be DEMS (diethoxymethylsilane) or any of the above mentioned first precursors.

The second precursor is a nanoscale porogen used to prepare films with pore size controlled on the scale of about 1 nanometer. Within the invention, the nanoscale porogen produces hydrocarbon radicals in the PECVD plasma with a limited distribution of sizes of radicals. This is done by choosing porogens containing one C=C double bond (known as alkenes), so the radicals in the plasma have one primary reactive site (the excited C=C, which may be abbreviated as *C—C* with a radical on each carbon).

Within the invention, other hydrocarbon molecules with one reactive site (including, for example, HO—R, alcohols, etc.) may be used. Examples of preferred nanoscale porogens are ethylene, propylene, butene, pentene, hexene, heptene, octene, and larger alkenes with greater than 8 carbon atoms, and linear or cyclic alkenes containing one C=C double bond.

Also, within the invention, a single alkoxysilane precursor may be used and said precursor then contains a built-in porogen consisting of at least one C=C double bond in the alkoxysilane precursor, and may optionally comprise one of vinyldimethylethoxysilane, vinylmethyldiethoxysilane, allylazadimethoxysilacyclopentane, allylaminopropyltrimethoxysilane, allyldimethoxysilane, allyldimethylsilane, allyloxy-t-butyldimethylsilane, allyloxytrimethylsilane, allyltetramethyldisiloxane, allyltriethoxysilane, allyltrimethoxysilane, bicycloheptenylethyltrimethoxysilane, bicycloheptenyltriethoxysilane, bisallyloxymethyltrimethylsiloxybutane, bisbicycloheptenylethyltetramethyldisiloxane, bistrimethylsiloxycyclobutene, butenyltriethoxysilane, butenyltrimethylsilane, (t-butyldimethylsiloxy)butyne, cyclohexenylethyltriethoxysilane, cyclohexenyltrimethoxysilane, cyclopentadienylpropyltriethoxysilane, cyclopentenyloxytrimethylsilane, cyclopentyltrimethoxysilane, diallyltetramethyldisiloxane, diethoxysilacyclopentene, divinyldiphenyldimethyldisiloxane, divinyldiphenyltetramethyldisiloxane, divinyltetraphenyldisiloxane, divinyltetramethyldisiloxane, divinyldimethylsilane, octenyltrimethoxysilane, octenyldimethylsilane, propenyltrimethylsilane, trimethylsilylcyclopentene, trivinylcyclotrisiloxane, trivinyltrisiloxane, trivinyltrimethylcyclotrisiloxane, trivinylpentamethyltrisiloxane, trivinylmethoxysilane, vinyldimethylethoxysilane, vinylmethyldiethoxysilane, vinylmethyldimethoxysilane, vinylmethylethoxysilane, vinylmethyldiethoxysilane, vinylmethyldimethoxysilane, vinylpentamethyldisiloxane, vinyltetramethyldisiloxane, vinyltri-t-butoxysilane, vinyltriethoxysilane, vinyltriisopropenoxysilane, vinyltriisopropoxysilane, and vinyltrimethoxysilane.

After deposition, the as deposited material is typically cured or treated using thermal, UV light, electron beam irradiation, chemical energy, or a combination of more than one of these, forming the final film having the desired mechanical and other properties described herein. For example, after deposition a treatment of the dielectric film (using both thermal energy and a second energy source) may be performed to stabilize the film and obtain improved properties. The second energy source may be electromagnetic radiation (UV, microwaves, etc.), charged particles (electron or ion beam) or may be chemical (using atoms of hydrogen, or other reactive gas, formed in a plasma).

In a preferred treatment, the substrate containing the film deposited according to the above process is placed in a ultraviolet (UV) treatment tool, with a controlled environment (vacuum or reducing environment containing $H_2$, or an ultra pure inert gas with a low $O_2$ and $H_2O$ concentration). A pulsed or continuous UV source may be used, a substrate temperature of 300°-450° C. may be used, and at least one UV wavelength in the range of 170-400 nm may be used. UV wavelengths in the range of 190-300 nm are preferred within the invention.

Within the invention, the UV treatment tool may be connected to the deposition tool ("clustered"), or may be a separate tool. Thus, as is known in the art, the two process steps will be conducted within the invention in two separate process chambers that may be clustered on a single process tool, or the two chambers may be in separate process tools ("declustered").

Figure 2:
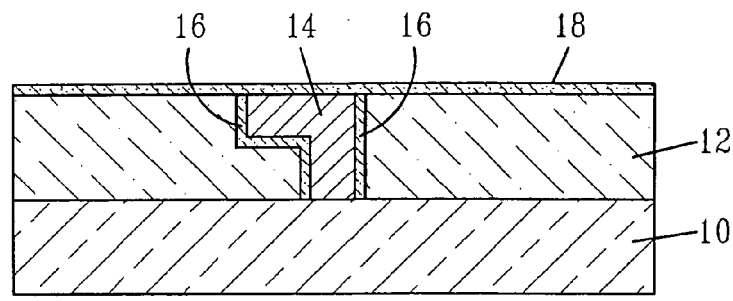
FIG. 2 is a pictorial representation (through a cross sectional view) illustrating an interconnect structure that includes the material of the first embodiment of the present invention.

The porous dielectric material of the present invention can be used in any semiconductor structure that requires the presence of a dielectric material. One example of such a semiconductor structure is shown in FIG. 2. Specifically, FIG. 2 shows a typical interconnect structure that includes a substrate 10 that may be semiconducting, insulating, conductive or any combination thereof, a porous dielectric material 12 of the present invention including conductive features 14 embedded therein. The conductive features 14 are in the form of conductive vias and lines. The conductive features 14 may be insulated from the dielectric material by a diffusion barrier 16 such as TaN or TiN. A dielectric capping layer 18 is typically located atop the dielectric material 12 and the conductive features 14 to contain the metal within the conductive features 14. The structure shown in FIG. 2 is fabricated using techniques, such as single damascene and dual damascene, that are well known to those skilled in the art.

Embodiment 2

In this embodiment, porous semiconducting materials are formed. The term "semiconducting" includes any element or compound having electrical conductivity intermediate between an insulator and a conductor. Examples of semiconducting materials that can be used in the present invention include, but are not limited to: Si, SiGe, SiGeC, SiC, Ge, GaAs, InAs, InP, AlN, GaN, InN, ternary alloys of Al, Ga, In, As, P, or N, silicon-on-insulators, SiGe-on-insulators, Ge-on-insulators, and other like materials.

The porous semiconductor materials of the present invention can be used as an element of a light emitting structure. Generally, light emitting structures require a crystalline semiconductor substrate. Also generally, the wavelength of the emitted light is adjusted by the band gaps of the semiconductor layers in the structure. These band gaps can be adjusted/modified either by doping of the crystalline semiconductor or changing the degree of crystallinity (feature size) and porosity of the semiconducting phase material.

The present invention provides a porous semiconducting material that may be deposited on a non-crystalline substrate, which has the ability to change (or adjust) the wavelength of the emitted light by adjustment of the feature size of the crystalline light emitting features.

The semiconducting material of this embodiment of the invention has a first solid phase and a second phase that is a collection of pores having pore size controlled on the nanometer scale. The first phase is comprised of nanometer scale, crystalline, semiconducting features characterized by an optical band gap that is approximately equal to the energy of the emitted light.

Figure 3:
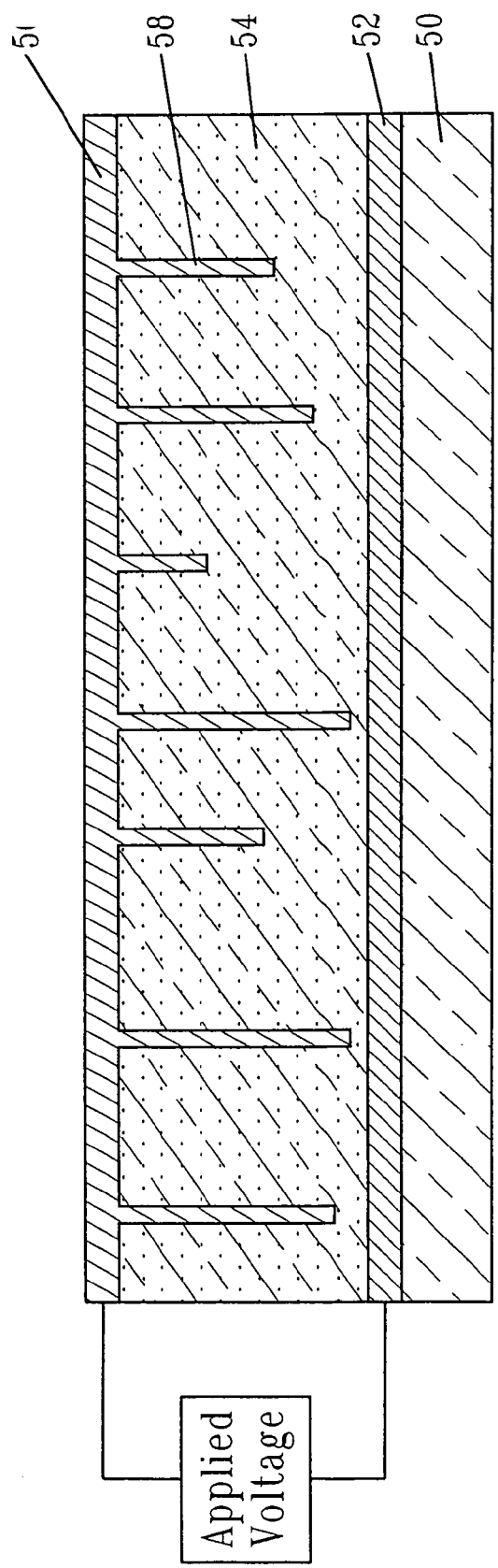
FIG. 3 is pictorial representation (through a cross sectional view) showing a light emitting structure that includes the material of the second embodiment of the present invention.

A light emitting structure of the present invention is shown in FIG. 3. In the drawing, reference numeral 50 is any substrate that meets the requirements of the structure to be made, including thermal stability and coefficient of thermal expansion. For example, the substrate 50 can be glass, quartz, or a semiconductor wafer containing previously fabricated logic or memory circuits. On top of the substrate, a conducting bottom contact, 52, is deposited. Typically one or more metal layers will form the bottom contact 52. In a preferred structure, the bottom contact 52 is smooth and acts as a mirror to reflect emitted light. On top of bottom contact 52 is a layer of the porous semiconducting material 54 of this embodiment of the present invention. The porous semiconducting material is formed using the processing technique described herein below. A conducting and transparent top contact 56 is located on top of the semiconducting material 54. The top contact 56 may be a thin metal or a transparent conductor such as indium tin oxide (ITO). Nanoscale regions 58 of top contact 56 are located within the voids in porous semiconductor material 54, and are in electrical contact with semiconducting material 54 and top contact 56.

In the second embodiment, the inventive porous material has a first solid phase that is a semiconducting material with a plurality of crystalline features. The features are electrically connected, and each feature has a characteristic dimension of about 1 to about 5 nm in size. In this embodiment, the second phase is the open space between the features of said first phase.

To form the structure of FIG. 3, or a related light emitting structure, the semiconducting film of this invention is deposited at a low temperature (on the order of about 400° C. or less, preferably less than 200° C.) together with a porogen gas using either a conventional thermal chemical vapor deposition (CVD) process or a low power plasma enhanced process. The porogen phases are incorporated into the film at low temperature, but are prevented from reacting with the semiconducting phase in the as deposited film. Then, a subsequent post deposition energy treatment is applied using thermal, UV light, E-Beam, or other energy (or a combination of these energy sources). During this treatment, the porogen phase is evolved from the as deposited film leaving the porous semiconducting material. The porogen phase is a sacrificial material used to create the nanometer scale pore structure.

More specifically, this method of the present invention includes a deposition step and a separate treatment step to modify the deposited film. In the deposition step, a 300 mm or 200 mm substrate is placed in a CVD reactor at a temperature of less than 400° C. and preferably less than 200° C. Any type of CVD deposition reactor may be used within the present invention including, but not limited to: PECVD, thermal CVD, remote plasma CVD, Plasma Assisted Atomic Layer Deposition (ALD), Atomic Layer Deposition, and the like with single wafer or multiwafer (batch) capability. A precursor mixture comprised of gas and/or liquid precursor flows is then stabilized to reach a pressure in the range from about 0.0001 to about 20 Torr for a time from about 5 to about 500 seconds. Examples of the precursors that can be used include, but are not limited to: hydrogenated silicon sources (silane, disilane and larger silanes), hydrogenated germanium sources ($GeH_4$, $Ge_2H_6$ and the like), and hydrido molecules of other semiconducting elements such as C, Al, Ga, In, As, P or N.

Examples of preferred porogen molecules include hydrocarbons containing one double bond, including, but not limited to: propene, butene, pentene, hexane, heptene, as well as cyclic forms of these molecules.

The semiconductor film can be co-deposited in mixture of two phases, the semiconductor and the porogen, or the film may be deposited in alternating layers of semiconductor and porogen at a low temperature (less than 400° C.).

Optionally, RF radiation is coupled to the reactor either by capacitive or inductive coupling. Moreover, a remote plasma unit can be used in some instances to supply reactive or excited species to the reactor. For the growth of the semiconducting material of the second embodiment, either two or three precursors may be used. At least one of the precursors contains at least atoms of Si, C, Ge, Ga, Al, N, In, As, Ti, Zn, or O. One of the remaining precursors is a hydrocarbon molecule, or porogen, with preferred molecules including, for example, ethylene, propylene, butene, pentene, hexene, heptene, octene, and larger alkenes with greater than 8 carbon atoms, and the linear or cyclic alkenes.

The semiconducting film made in the deposition step includes a first solid phase divided into structural features that contain the atoms of Si, C, Ge, Ga, Al, N, In, As, Ti, Zn or O. These features are typically not crystalline at this point, after deposition. In a later step, the first phase will become a semiconducting material with a plurality of crystalline features. As indicated above, the crystalline features present in the first phase are electrically connected and each of the features has a characteristic dimension of about 1 to about 5 nanometer size. This film also contains a second phase that is comprised essentially of C and H (an organic phase) and will be removed in the treatment step.

In the treatment step, the substrate containing the film formed in the deposition step is heated to a temperature higher than the deposition temperature for a time of 1 second to 4 hours, and optionally a second energy source is simultaneously applied. The second energy source may be UV, visible, IR or electron beam radiation, chemical or microwave energy. In this step, the second organic phase is removed and also the first phase is converted into a semiconducting material with a plurality of crystalline features that are electrically connected. This treatment temperature or the temperature of a subsequent treatment is sufficiently high to crystallize the semiconductor material.

In an alternative embodiment, a spraying technique (including electric field assisted spray) that is capable of forming nano droplets of porogen can also be used to co-deposit the semiconducting and porogen phases at low temperature to form the as deposited film.

Third Embodiment

In this embodiment of the present invention a porous catalyst material is provided. Generally, chemically active metal catalysts are distributed on a high surface area porous support. Also generally, the size of the metal particles or features on the catalysts is not controlled and is not easily adjusted. The present invention provides a metal catalyst material that may be deposited directly on a variety of substrates, producing controlled metal particles with the feature size adjusted in the deposition step. The applications of this material include catalysts as well as sensors.

Figure 4A:
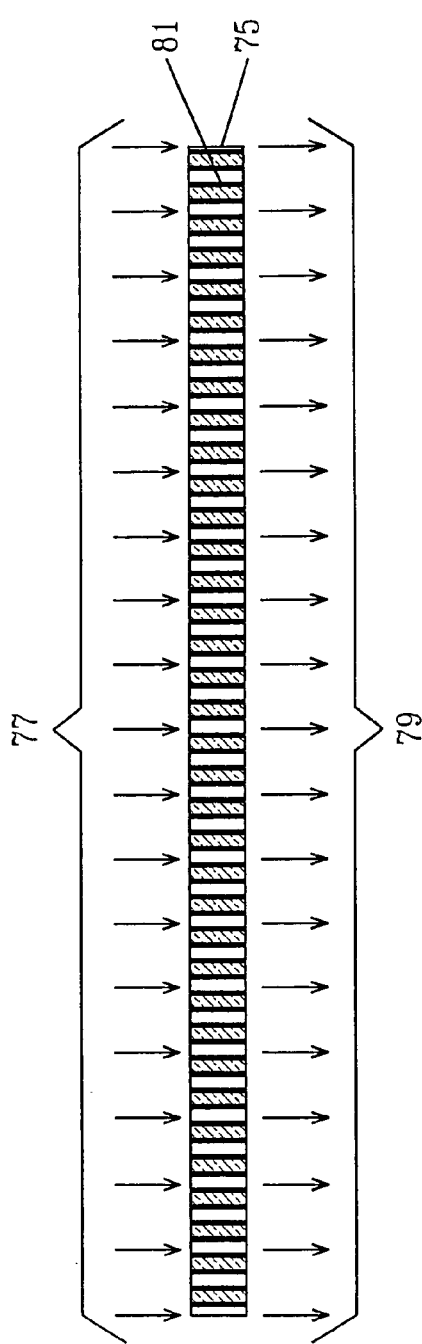
FIGS. 4A and 4B are pictorial representations (through cross sectional views) showing example structures using the catalyst material of the third embodiment of the present invention.
Figure 4B:
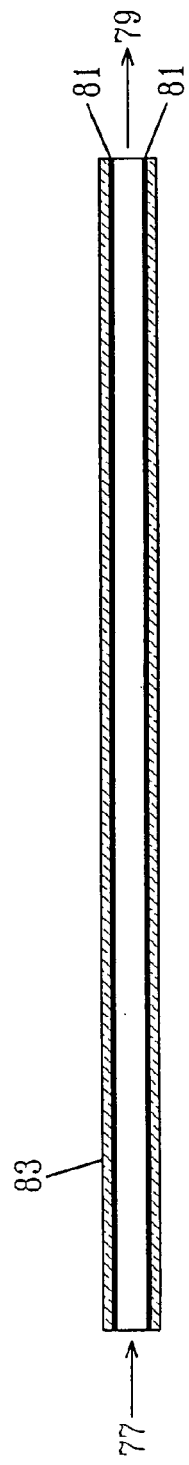

Examples of schematic structures using the material of the third embodiment of this invention are shown in FIGS. 4A and 4B. In FIG. 4A, a glass capillary wall 75, separates a gas flow in, 77, and a gas flow out, 79. On the walls of the capillaries 75 is a deposited metal material of this invention 81, which is made according to the third embodiment.

In FIG. 4B, a tube or pipe, 83, has deposited on the interior wall a deposited metal material coating 81 of this invention made according to the third embodiment. Gas flow in, 77, and out, 79, of the tube 83 contain the molecules to be processed using the novel catalyst of this invention.

In this third embodiment, the inventive material has a first solid phase that is a metal material with a plurality of features, in which each feature has a characteristic dimension from about 0.5 to about 5 nm in size. In this embodiment, the second phase is the open space between the features of the first phase. The material may be deposited as a coating, as shown in FIGS. 4A and 4B.

In preferred examples of the third embodiment, the first phase is Pt, Pd, Ru, Rh, Re, Au, Ag, Ni, Fe, Co, Ti, or other catalytic metals. The as deposited film contains a first metal phase and a second sacrificial phase. In one embodiment of the present invention, the sacrificial second phase within the film is non-reactive, such as the gases Xe or Ar, and the film is deposited below room temperature (low temperature deposition). In another embodiment, the sacrificial phase is an organic phase within the film. In yet other embodiments of the present invention, the organic phase within the film may be formed using a porogen with one C=C double bond, such as, for example, ethylene, propylene, butene, pentene, hexene, octene, cyclic forms of those molecules, and larger alkenes with greater than 8 carbon atoms. In still another embodiment of the present invention, the organic phase may be formed using a wide range of porogen molecules including, but not limited to: organic molecules and the porogens described in U.S. Pat. Nos. 6,147,009, 6,312,793, 6,441,491, 6,437,443, 6,541,398, 6,479,110 B2, and 6,497,963, the contents of which are incorporated herein by reference.

The as deposited film is then treated in a separate subsequent energy treatment using UV, thermal, E-beam, microwave or another energy source as described above in the first embodiment. In a preferred example, Pt and Pd precursors containing a ligand such as cyclooctadiene (COD), hexafluoroacetylacetonate (HFAC) or $C_4H_7$ are used, with specific examples being $Pt(CH_3)_2(COD)$ and $Pd(C_4H_7)(HFAC)$. These precursors decompose to deposit metal films in the temperature range from about 50° to about 100° C., and a second organic precursor may be mixed with the Pt or Pd precursor. Other embodiments would include metal precursors including metal alkyls, metal trifluorophospines, metal olefins, alkynes, allyls, metallocenes, metal cyclopentadienyls, metal carbonyls, metal halides, metal β-diketonates and β-ketoiminates. Generally, the sacrificial phase is an organic phase within the film. In one embodiment, the sacrificial organic phase is produced using a second precursor that is selected from the group of hydrocarbons containing one C=C double bond. This group includes, but is not limited to: ethylene, propylene, butene, pentene, hexene, heptene, octene, cyclic forms of these molecules and larger alkenes with greater than 8 carbon atoms. In another embodiment, the organic phase may be formed using a wide range of porogen molecules including, but not limited to: organic molecules and the porogens described in U.S. Pat. Nos. 6,147,009, 6,312,793, 6,441,491, 6,437,443, 6,541,398, 6,479,1110 B2, and 6,497,963, the contents of which are incorporated herein by reference.

The as deposited film contains a first metal phase and a second organic phase. This film is then modified in a treatment step, in which the organic phase is removed, leaving the porous metal material of the third embodiment. Optionally, the sacrificial phase is covalently bound to the metal phase in the as deposited film, and the post deposition treatment step removes the sacrificial second phase.

Fourth Embodiment

In this embodiment of the present invention a porous ceramic material is provided. Specifically, the inventive material in this embodiment has a first solid phase that is a ceramic material with a plurality of features, where each feature has a characteristic dimension from about 0.5 to about 5.0 nanometer in size. In this embodiment, the second phase is the open space between the features of the first phase. The first phase may be comprised of $Al_2O_3$, $SiO_2$, an aluminosilicate, a metal oxide or nitride or carbide, or a similar stable material.

To form the material of the fourth embodiment of the present invention, two steps are used as in the above embodiments. The as deposited film contains a first metal phase and a second organic phase. This film is then changed in an oxidizing treatment step, in which the organic phase is removed and in which the metal phase becomes oxidized, leaving the porous oxide (ceramic) material of the fourth embodiment. The oxidizing treatment step may be exposure to an oxygen ($O_2$) containing ambient at high temperature (>400° C.) or exposure to an oxidizing plasma ($O_2$, $CO_2$, $H_2O$) at any temperature. In preferred examples of the fourth embodiment, the first phase is comprised of Al, an AlTi alloy, or an AlSi alloy. The as deposited film also contains a second sacrificial phase that is an organic phase and is derived from a porogen molecule such as ethylene, propylene, butene, pentene, hexene, heptene, octene, cyclic forms of these molecules, and larger alkenes with greater than 8 carbon atoms.

The oxidizing treatment step uses an energy source such as UV, thermal, E-beam, microwave or another energy source, and an oxidizing atmosphere such as $O_2$, $N_2O$, or ozone. Optionally, the temperature of the oxidizing treatment step may be from about 400° C. to about 1000° C. to ensure complete oxidation and formation of a stable ceramic material. By combining the oxidizing atmosphere with high temperature (or another energy source), the first phase is converted into a metal oxide or aluminosilicate and the first phase is comprised of features each having characteristic dimensions mentioned above.

Optionally, the nanoporous metal of the third embodiment of the present invention may be added to the porous ceramic material of the fourth embodiment, to form a catalyst material with high internal surface area and nano-scale metal features.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a porous composite material comprising:
   providing a precursor combination of a first precursor and a second precursor into a reactor chamber, wherein at least one of said first or second precursor is a porogen selected from the group consisting of a liner compound containing at least one C=C double bond and an alcohol;
   depositing a film from said precursor combination; and
   removing said porogen from said film to provide a porous composite material comprising a first solid phase having a first characteristic dimension and a second phase comprised of pores having a second characteristic dimension, wherein said pores have a pore size distribution having a maximum that is less than about 1 nm, a full width at half maximum in the pore size distribution ranging from 1 to 3 nm, and with a fraction less than 0.1 of pores having a pore size of greater than about 1 nm, and wherein said removing said porogen comprises UV treatment in a vacuum, a reducing environment containing $H_2$, or a pure inert gas.

2. The method of claim 1 wherein one of said first or second precursors is an alkoxysilane.

3. The method of claim 1 wherein said porogen is selected from the group consisting of ethylene, propylene, butene, pentene, hexene, heptene, octene, and alkenes with greater than 8 carbon atoms.

4. The method of claim 1 wherein said UV treatment comprises UV wavelengths in a range of 190 nm to 300 nm.

5. The method of claim 1 wherein said first solid phase provides a dielectric material including atoms of Si, C, O and H.

6. The method of claim 1 wherein said first solid phase provides a semiconductor material selected from the group consisting of Si, SiGe, SiGeC, SiC, Ge, GaAs, InAs, InP, AlN, GaN, InN, and ternary alloys of Al, Ga, In, As, P or N.

7. The method of claim 6 wherein one of said first and second precursors is selected from the group consisting of a hydrogenated silicon source and a hydrogenated germanium source.

8. The method of claim 1 wherein said first solid phase is a metal selected from the group consisting of Pt, Pd, Ru, Rh, Re, Au, Ag, Ni, Fe, Co and Ti.

9. The method of claim 8 wherein one of said first and second precursors is a metal-containing precursor including said metal selected from the group consisting of Pt, Pd, Ru, Rh, Re, Au, Ag, Ni, Fe, Co and Ti.

10. The method of claim 1 wherein said first solid phase is a ceramic selected from the group consisting of $Al_2O_3$, $SiO_2$, an aluminosilicate, a metal oxide, a metal nitride, and a metal carbide.

11. The method of claim 1 wherein said first solid phase is selected from the group consisting of Al, an AlTi alloy and an AlSi alloy.

12. The method of claim 5 wherein said dielectric material has an elastic modulus from 3 to 15 GPa.

13. A method of forming a porous composite material comprising:
   providing a precursor combination of a first precursor and a second precursor into a reactor chamber, wherein at least one of said first or second precursor is a porogen selected from the group consisting of a liner compound containing at least one C=C double bond and an alcohol;
   depositing a film from said precursor combination; and
   removing said porogen from said film to provide a porous composite material comprising a first solid phase having a first characteristic dimension and a second phase comprised of pores having a second characteristic dimension, wherein said pores have a pore size distribution having a maximum that is less than about 1 nm, a full width at half maximum in the pore size distribution ranging from 1 to 3 nm, and with a fraction less than 0.1 of pores having a pore size of greater than about 1 nm, and wherein said removing said porogen comprises one of thermal treatment, UV treatment, treatment by electron beam irradiation, treatment with chemical energy, or a combination thereof and wherein said first solid phase provides a semiconductor material selected from the group consisting of Si, SiGe, SiGeC, SiC, Ge, GaAs, InAs, InP, AlN, GaN, InN, and ternary alloys of Al, Ga, In, As, P or N.

* * * * *